US012108134B2

(12) United States Patent
Lee et al.

(10) Patent No.: US 12,108,134 B2
(45) Date of Patent: Oct. 1, 2024

(54) METHODS FOR MANUFACTURING PHASE MASKS AND LENS-LESS CAMERA MODULE

(71) Applicant: UIF (University Industry Foundation), Yonsei University, Seoul (KR)

(72) Inventors: Seung Ah Lee, Seoul (KR); Hye Suk Chae, Seoul (KR); Yu Jin Lee, Seoul (KR); Kyung Chul Lee, Yongin-si (KR); Nak Kyu Baek, Seoul (KR); Tae Young Kim, Seoul (KR); Jae Woo Jung, Seoul (KR)

( * ) Notice: Subject to any disclaimer, the term of this patent is extended or adjusted under 35 U.S.C. 154(b) by 108 days.

(21) Appl. No.: 18/168,887

(22) Filed: Feb. 14, 2023

(65) Prior Publication Data
US 2023/0291986 A1    Sep. 14, 2023

(30) Foreign Application Priority Data

Mar. 8, 2022   (KR) .................. 10-2022-0029124
May 3, 2022    (KR) .................. 10-2022-0054616

(51) Int. Cl.
H04N 23/55    (2023.01)
G03F 1/26     (2012.01)
G03F 1/44     (2012.01)
G03F 7/00     (2006.01)
H04N 23/955   (2023.01)

(52) U.S. Cl.
CPC ............ H04N 23/55 (2023.01); G03F 1/26 (2013.01); G03F 1/44 (2013.01); G03F 7/0017 (2013.01); H04N 23/955 (2023.01)

(58) Field of Classification Search
None
See application file for complete search history.

(56) References Cited

U.S. PATENT DOCUMENTS

2018/0217494 A1*  8/2018  Taylor .................. G03F 7/0002

FOREIGN PATENT DOCUMENTS

KR    10-2009-0077836 A    7/2009

OTHER PUBLICATIONS

Y. Lee et al., "Fabrication of Integrated Lensless Cameras via UV-Imprint Lithography," in IEEE Photonics Journal, vol. 14, No. 2, pp. 1-8, Apr. 2022, Art No. 0620008, doi: 10.1109/JPHOT.2022.3157373.
K.C.Lee et al., "Design and high-throughput fabrication of custom phase-masks for lensless cameras", SPOI OPTO Mar. 5, 2022.

* cited by examiner

Primary Examiner — Mark T Monk

(57) ABSTRACT

A method for manufacturing a phase mask and a lens-less camera module comprises the steps of: obtaining a replica mold on which an inverted phase shift pattern is formed in which a phase shift pattern of a master phase mask spaced apart from an image sensor is inverted; calculating a thickness of a phase mask disposed on the image sensor replacing the master phase mask; arranging a photocurable material for implementing the phase mask on the image sensor to a calculated thickness, placing the replica mold on an upper surface of the photocurable material, and then curing the photocurable material; and removing the replica mold from the top of the phase mask, so that the focal distance change or parallel movement does not occur depending on the position of the phase mask.

17 Claims, 10 Drawing Sheets

METHODS FOR MANUFACTURING PHASE MASKS AND LENS-LESS CAMERA MODULE

CROSS-REFERENCE TO RELATED APPLICATIONS

This application claims priority under 35 U.S.C. § 119(a) to Korean Patent Application No. 10-2022-0029124, filed on Mar. 8, 2022, and Korean Patent Application No. 10-2022-0054616, filed on May 3, 2022, with the Korean Intellectual Property Office, the disclosure of which are incorporated herein in their entirety by reference.

BACKGROUND

1. Technical Field

Embodiments described herein relate to methods for manufacturing phase masks and lens-less camera modules.

2. Description of the Related Art

A general camera is a lens camera, in which a lens is disposed in a direction in which light is incident, and a point light source in each scene is imaged in the form of a point on the image sensor through the lens, so that an image is obtained.

On the other hand, in a lens-less camera, an amplitude mask or a phase mask that replaces a lens is disposed in a direction in which light is incident, and an incident point light source is modulated by the mask to form an image on an image sensor. This method of acquiring an image without including a lens is called a lens-less imaging method, and recently, research on a lens-less camera using a phase mask has been actively conducted.

A phase mask is more efficient in terms of light collection compared to an amplitude mask. In addition, it is characterized by imaging based on a unique pattern having shift-invariance characteristics. Accordingly, phase mask-based lens-less imaging has the advantage of providing a more robust image model than amplitude mask-based lens-less imaging.

FIGS. 1A and 1B show an example of a phase mask and a point spread function, and FIGS. 2A and 2B are a diagram for explaining a phase mask-based lens-less imaging method.

FIG. 1A represents a phase mask, and FIG. 1B represents a point spread function (PSF) for the phase mask of FIG. 1A.

As shown in FIG. 1A, in the phase mask 11, a unique pattern is formed in a curved shape having a different height for each position on one surface of a transparent material flat plate through which light can be transmitted. By this unique pattern, the light passing through the phase mask is diffusion-modulated by changing the phase differently depending on the incident position, so that the unique image according to the unique pattern as shown in FIG. 1B is formed in a direction opposite to the direction in which light is incident. At this time, as shown in FIG. 2A, the unique image appears blurry or clear depending on the distance between the phase mask and the imaging plane (typically an image sensor) 12 on which the image is formed, and the distance between the phase mask and the imaging plane where the unique image appears most clearly is called a focal distance (f), and the unique image appearing at the focal distance (f) is called a Point Spread Function (PSF).

Accordingly, in the phase mask-based lens-less imaging method, instead of a lens module, the phase mask 11 is spaced apart from the front of the image sensor 12. In addition, on one surface of the phase mask 11, a unique pattern having an irregular size, height, shape, etc. is formed for each location. Since the unique pattern formed on one surface of the phase mask 11 causes a phase change by delaying transmitted light differently for each location, it can also be referred to as a phase shift pattern.

Since the lens-less camera does not include a lens that focuses a point light source, the point light source diffusely incident on the phase mask 11 is converted into a pattern according to a phase shift pattern and is incident on the image sensor 12. That is, it is obtained as an image in which the point light source is diffused to the entire area of the image sensor according to the phase shift pattern formed on the phase mask 11. In this case, when the phase mask 11 is spaced apart from the image sensor 12 by the focal distance (f), a point spread function (PSF) appears in which the pattern of light modulated by the phase mask 11 is the sharpest.

In the phase mask-based lens-less imaging method, when an object having a size other than a point is photographed, that is, when a scene is photographed, as shown in FIG. 2B, it can be seen that lights emitted from point light sources for each position of the scene overlap and enter the image sensor 12 through the phase mask 11. Accordingly, the point spread function (PSF) projected onto the image sensor is shifted as a whole according to the location of each point light source. Therefore, when a scene is captured, since a plurality of point spread functions (PSF) are shifted and overlapped and incident on the image sensor 12 by a plurality of point light sources constituting the scene, the image sensor 12 obtains a raw image 13 as shown in FIG. 2B.

In addition, the raw image 13 obtained by the image sensor 12 in the lens-less imaging method can be converted into an image of the same type as the lens-based imaging method by performing an inverse operation using a point spread function (PSF) again.

In order to reconstruct high-quality images in phase mask-based lens-less imaging, the point spread function (PSF) must appear clearly on the image sensor. That is, the sharpness of the point spread function (PSF) pattern projected onto the image sensor is very important. In addition, the sharpness of the point spread function (PSF) pattern is also influenced by the phase shift pattern of the phase mask, but is greatly influenced by the focal distance (f) representing the distance between the phase mask and the image sensor. Therefore, in order to obtain a high-quality image, it is important that the focal distance between the phase mask and the image sensor is accurately maintained at a required distance.

In a conventional phase mask-based lens-less camera, a separately manufactured phase mask is disposed and supported at a position spaced apart from the image sensor using a spacer or the like, such that the phase mask is maintained at a distance away from the image sensor by a focal distance. However, in the case of using a support such as a spacer, a difference may occur between a distance to the image sensor according to the placement of the phase mask and a designed focal distance. In addition, even if the distance to the image sensor matches the focal distance, the phase mask may also be laterally shifted and disposed. As such, there is a limitation in that, when the position of the phase mask is changed, the sharpness of the point spread function (PSF) is lowered, or if the phase mask is shifted and an alignment error occurs, it is difficult to reconstruct images obtained from different lens-less cameras with a single point spread function (PSF) in high quality. That is, there is a problem in that an image of a required quality cannot be obtained due to a placement error of the phase mask for each lens-less camera. In addition, since a complicated assembly process is required, productivity is lowered and manufacturing cost is increased.

In addition, unlike lenses generally formed of glass, most current phase masks are implemented with a flexible material that can be bent due to manufacturing characteristics. Accordingly, even if the phase mask is accurately placed and supported at a designated position by a spacer, there is a problem that the sharpness of the point spread function (PSF) may be lowered due to the subsequent bending or the like of the phase mask itself.

STATEMENT REGARDING PRIOR DISCLOSURES BY THE INVENTOR OR A JOINT INVENTOR

At least one inventor or joint inventor of the present disclosure has made related disclosures in a research paper (IEEE PHOTONICS JOURNAL, VOL. 14. 2022) on Mar. 8, 2022, which was included in the information disclosure statement submitted on Feb. 14, 2023.

SUMMARY

An object of the present disclosure is to provide an apparatus and method for manufacturing a phase mask that is inexpensive, fast, and easy to mass-produce.

Another object of the present disclosure is to provide an apparatus and method for manufacturing a phase mask in which a phase mask is directly formed on an image sensor and thus does not cause a change in focal distance or a change in placement, so that a lens-less camera can obtain a high-quality reconstructed image.

A method for manufacturing a phase mask according to an embodiment of the present disclosure, conceived to achieve the objectives above, comprises the steps of: obtaining a replica mold on which an inverted phase shift pattern is formed in which a phase shift pattern of a master phase mask spaced apart from an image sensor is inverted; calculating a thickness of a phase mask disposed on the image sensor replacing the master phase mask; arranging a photocurable material for implementing the phase mask on the image sensor to a calculated thickness, placing the replica mold on an upper surface of the photocurable material, and then curing the photocurable material; and removing the replica mold from the top of the phase mask.

The step of calculating a thickness may include determining the thickness of the phase mask, such that the light incident to the master phase mask at an incident position and an incident angle is projected at the same projection position and projection angle of the image sensor after the master phase mask is replaced by the phase mask.

The step of calculating a thickness may include, when the master phase mask is spaced apart from the image sensor using a ray tracing technique, obtaining a master model modeling a path on which incident light incident to the master phase mask is projected onto the image sensor, and when the phase mask is disposed on the image sensor, obtaining an alternative model modeling a path on which incident light incident to the phase mask is projected onto the image sensor, and setting the incident position and incident angle, projection position and projection angle the same in the master model and the alternative model, thereby calculating the thickness of the phase mask.

The image sensor may include a sensor chip for sensing light and a cover glass spaced apart from the sensor chip with an air layer interposed therebetween, and the phase mask may be formed on the cover glass.

The distance between the master phase mask and the image sensor may be calculated using a focal distance at which a point spread function according to a phase shift pattern of the master phase mask detected by the image sensor appears most clearly.

The distance between the master phase mask and the image sensor may be obtained by measuring a distance at which a full-width at half maximum (hereinafter, FWHM) according to a diffusion range of the incident light incident on the master phase mask detected by the image sensor is minimized.

The step of obtaining a replica mold may include forming a replica mold by disposing and curing a mold replication agent on one surface of the master phase mask on which the phase shift pattern is formed, and separating the formed replica mold from the master phase mask.

The step of curing may include determining a height of a supporter with the calculated thickness of the phase mask, placing the supporter having the determined height around the image sensor, injecting a photocurable material for implementing the phase mask into a space formed by the image sensor and the supporter, placing the inverted phase shift pattern formed in the replica mold to contact the upper surface of the injected photocurable material, and then curing the photocurable material by irradiating light thereon to form a phase mask integrally coupled to the image sensor.

The step of removing the replica mold may include separating the replica mold from the phase mask, and removing the supporter placed around the image sensor.

A method for manufacturing a lens-less camera module according to an embodiment of the present disclosure comprises the steps of: obtaining a replica mold on which an inverted phase shift pattern is formed in which a phase shift pattern of a master phase mask spaced apart from an image sensor is inverted; calculating a thickness of a phase mask disposed on the image sensor replacing the master phase mask; arranging a photocurable material for implementing the phase mask on the image sensor to a calculated thickness, placing the replica mold on an upper surface of the photocurable material, and then curing the photocurable material; removing the replica mold from the top of the phase mask; and coupling the image sensor, on the upper surface of which the phase mask is integrally formed, to a module substrate.

Accordingly, an apparatus and method for manufacturing a phase mask according to an embodiment of the present disclosure forms a phase mask directly on an image sensor, so that the focal length change or parallel movement does not occur depending on the position of the phase mask. Accordingly, the lens-less camera module can acquire high-quality reconstructed images, and the lens-less camera module can be produced quickly and at low cost. In addition, since the phase mask is placed directly on the image sensor, the durability of the lens-less camera module is improved, and since phase masks having the same phase shift pattern can be easily manufactured, it is suitable for mass production of the lens-less camera module.

DETAILED DESCRIPTION OF THE INVENTION

Hereinafter, specific embodiments of an embodiment will be described with reference to the drawings. The following detailed description is provided to assist in a comprehensive understanding of the methods, apparatus and/or systems described herein. However, this is only an example, and the present disclosure is not limited thereto.

In describing the embodiments, when it is determined that detailed descriptions of known technologies related to the present disclosure may unnecessarily obscure the gist of the disclosed embodiments, detailed descriptions thereof will be omitted. In addition, terms used below are defined in consideration of functions in the present disclosure, which may vary depending on the customary practice or the intention of users or operators. Therefore, the definition should be made based on the contents throughout this specification. The terms used in the detailed description are only for describing embodiments, and should not be limiting. Unless explicitly used otherwise, expressions in the singular form include the meaning of the plural form. In this description, expressions such as "comprising" or "including" are intended to refer to certain features, numbers, steps, actions, elements, some or combination thereof, and it is not to be construed to exclude the presence or possibility of one or more other features, numbers, steps, actions, elements, parts or combinations thereof, other than those described. In addition, terms such as "unit", "device", "module", "block", and the like described in the specification refer to units for processing at least one function or operation, which may be implemented by hardware, software, or a combination of hardware and software.

Figure 3:
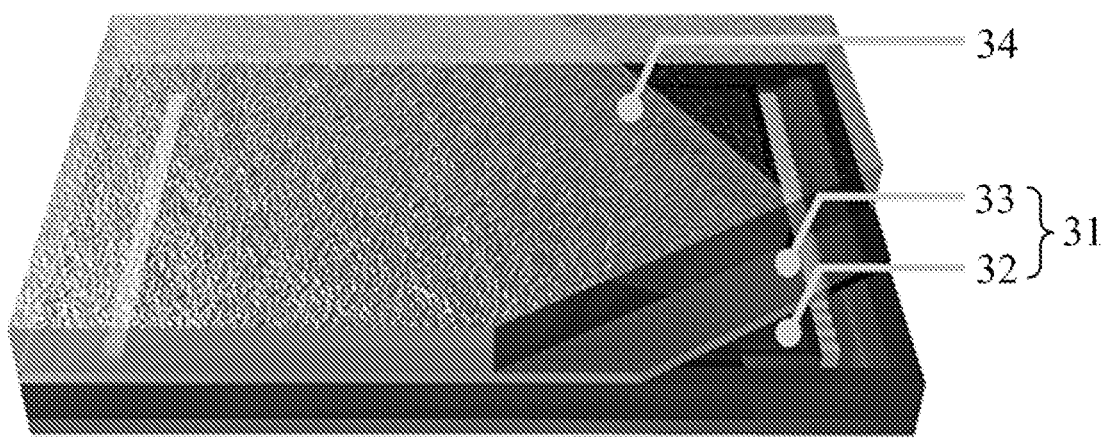
FIG. 3 shows a schematic structure of a phase mask to be manufactured according to an embodiment.

FIG. 3 shows a schematic structure of a phase mask to be manufactured according to an embodiment.

Referring to FIG. 3, in the embodiment, the phase mask 34 is not generated separately from the image sensor 31, but directly manufactured on the image sensor 31. As such, if the phase mask 34 is manufactured and formed directly on the image sensor 31, the phase shift pattern formed on the phase mask 34 is supported by the thickness of the phase mask 34 itself, so that an additional process for disposing the phase mask 34 apart from the image sensor 31 is unnecessary, and a spacer is also not required.

Accordingly, not only the manufacturing process of the lens-less camera is simplified, but also problems, such as deterioration in the sharpness of the point spread function (PSF) and movement of the reference position due to process errors or the like in disposing the phase mask 34, can be prevented from occurring. In addition, since the phase mask 34 is not supported by a spacer or the like, but is supported by its own thickness, there is a low possibility that the phase mask 34 will undergo a change such as bending, even with the passage of time.

The image sensor 31 may be implemented with a sensor chip 32, but in many cases, a cover glass 33 is further formed to protect the sensor chip 32. In this case, the phase mask 34 may be formed on the cover glass 33 as shown in FIG. 3. However, when the image sensor 31 is implemented with a sensor chip 32, the phase mask 34 may be formed on the sensor chip 32 to perform phase shift and simultaneously protect the sensor chip 32 by replacing the cover glass 33.

Figure 4:
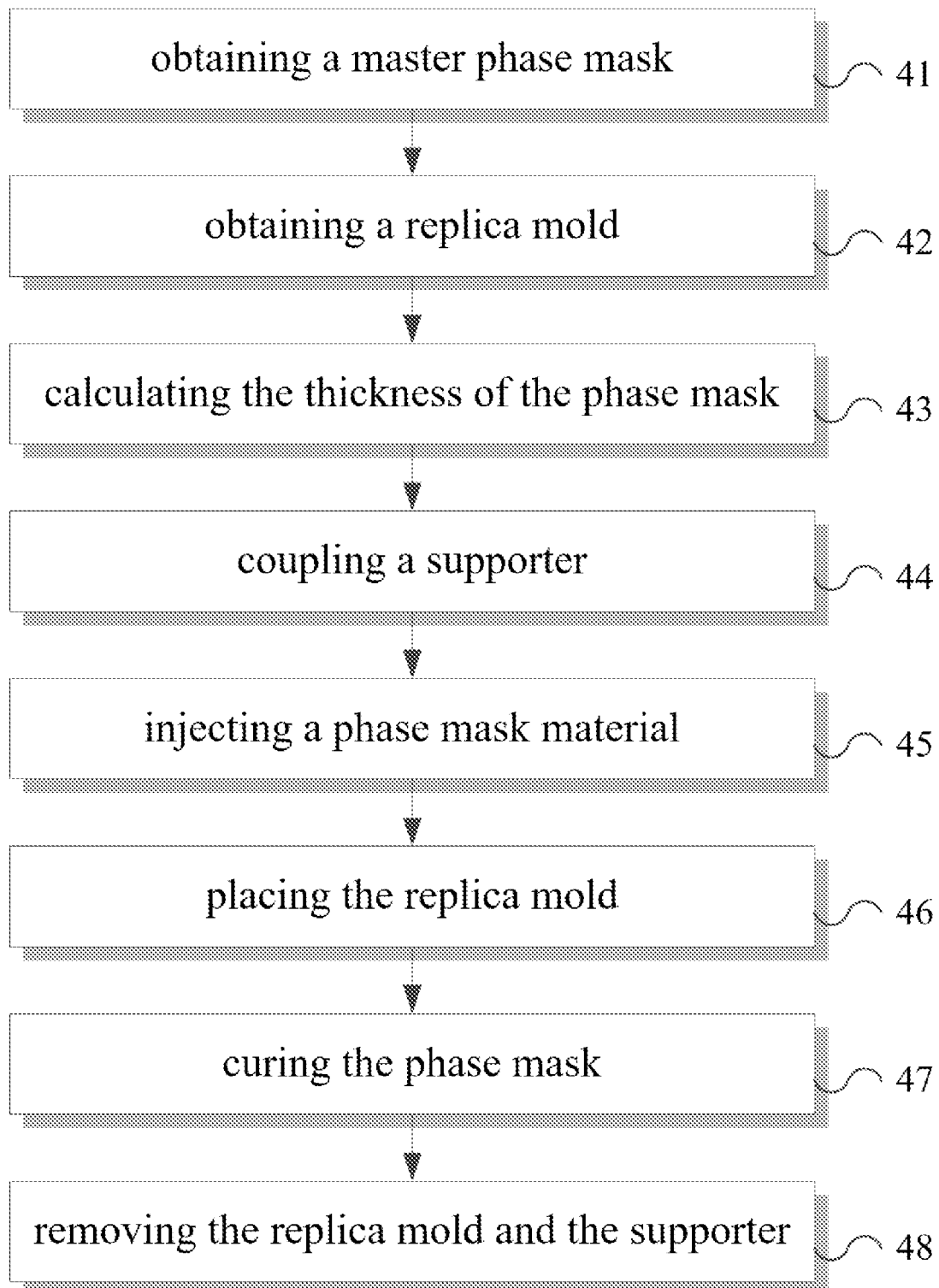
FIG. 4 shows a method for manufacturing a phase mask according to an embodiment.
Figure 5A:
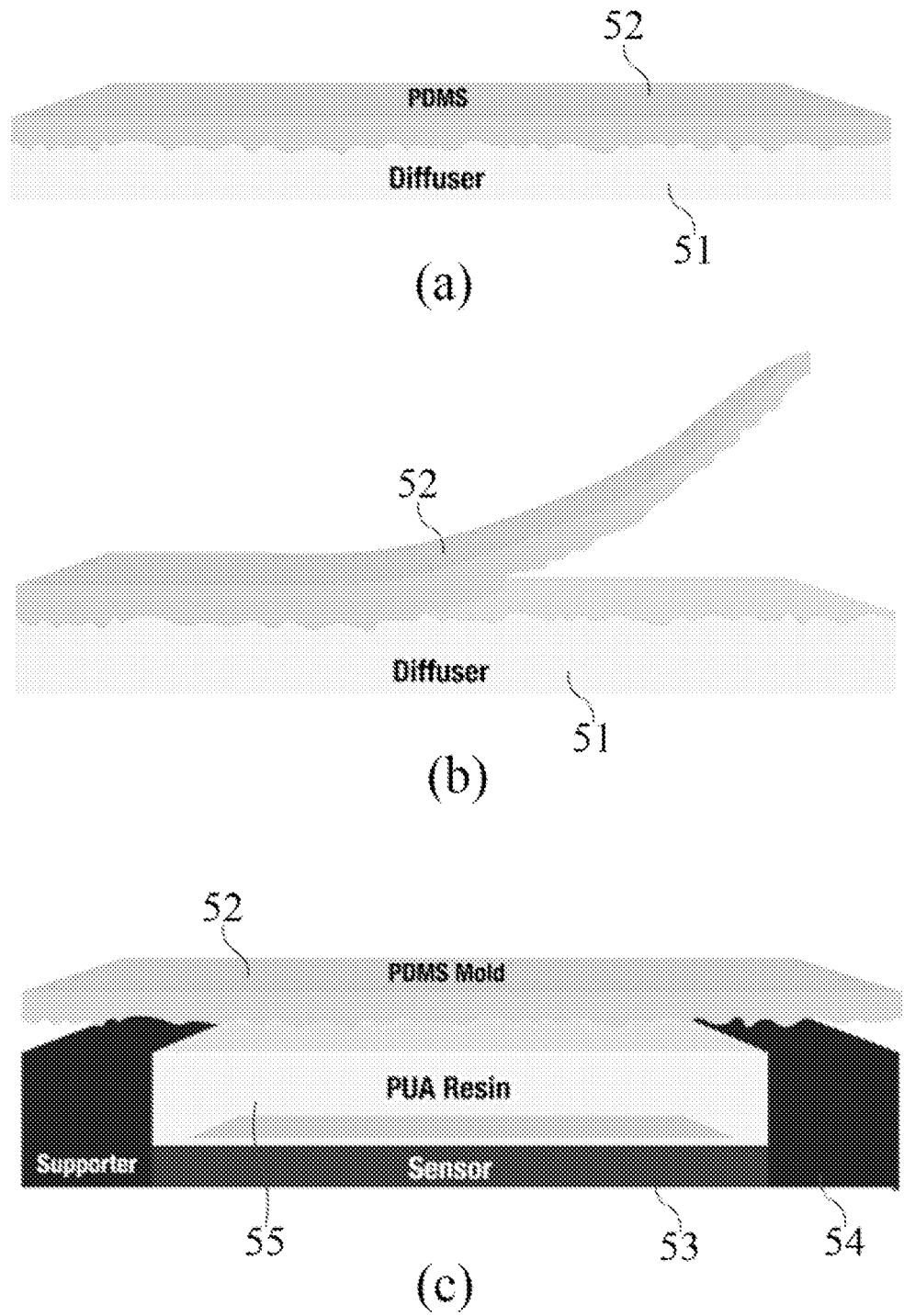
FIGS. 5A and 5B show a process of manufacturing a phase mask according to the method of manufacturing a phase mask of FIG. 4.
Figure 5B:
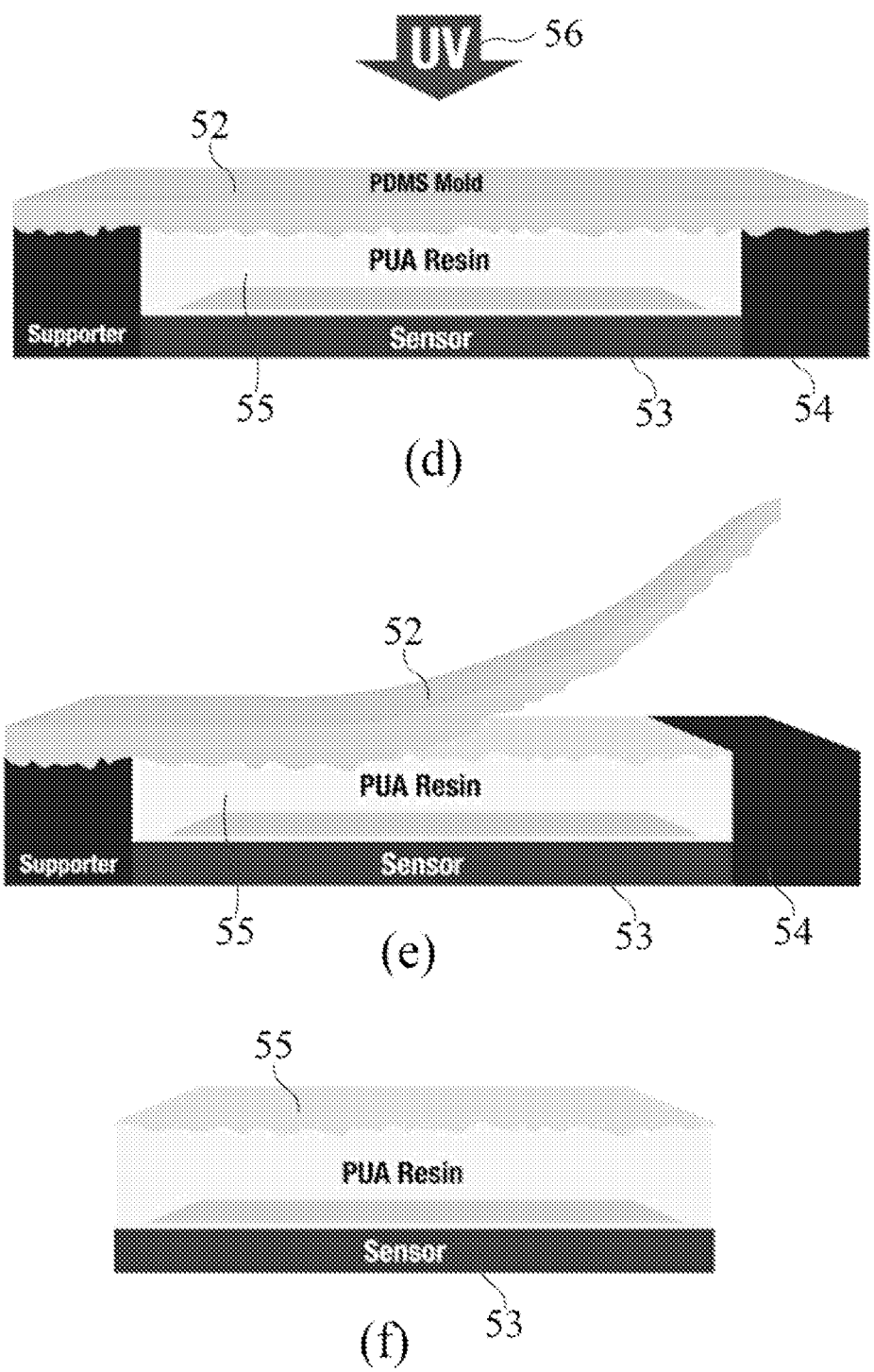

FIG. 4 shows a method for manufacturing a phase mask according to an embodiment, and FIGS. 5A and 5B shows a process of manufacturing a phase mask according to the method of manufacturing a phase mask of FIG. 4.

Referring to FIGS. 4, 5A and 5B, in the phase mask manufacturing method according to the embodiment, first, a master phase mask 51 is obtained (41). The master phase mask 51 is a phase mask on one surface of which is formed a phase shift pattern according to an application. The master phase mask 51 may be a previously manufactured phase mask already used for a lens-less camera. That is, it may be a phase mask applied to an existing lens-less camera. However, the master phase mask may be separately manufactured using a conventional phase mask manufacturing technique, such as a 3D printing technique, to manufacture the phase mask of the embodiment. The phase mask may be manufactured by precisely forming a required phase shift pattern using a 3D printing technique or the like, and may be formed in the form of a diffusion plate or a diffusion film. However, as described above, the conventional phase mask manufacturing technique requires the phase mask to be separately manufactured from the image sensor 12 and requires a long manufacturing time, and thus is not suitable for mass production.

Accordingly, in the embodiment, a phase mask manufactured to have a required phase shift pattern according to a conventional phase mask manufacturing technique is used as a master phase mask 51 providing a phase shift pattern for mass production.

When the master phase mask 51 is obtained, a replica mold 52 is obtained in which the phase shift pattern formed on one surface of the obtained master phase mask 51 is replicated (42). For example, the replica mold 52 can be obtained by mixing and placing a mold replication agent of a flexible material such as poly-dimethyl siloxane (hereinafter, PDMS) with a curing agent on one surface of the master phase mask 51 on which the phase shift pattern is formed, and heating and curing the mold replication agent. As a specific example, as shown in (a) and (b) of FIG. 5A, the replica mold 52 can be obtained by, while heating the mold replication agent disposed on one surface of the master phase mask 51 in an oven at 80° C. for 1 hour, removing air bubbles and curing, and then separating the cured replica mold 52 from one surface of the master phase mask 51.

At this time, on one surface of the obtained replica mold 52, an inverted phase shift pattern is formed in which the phase shift pattern of the master phase mask 51 is inverted.

Figure 1A:
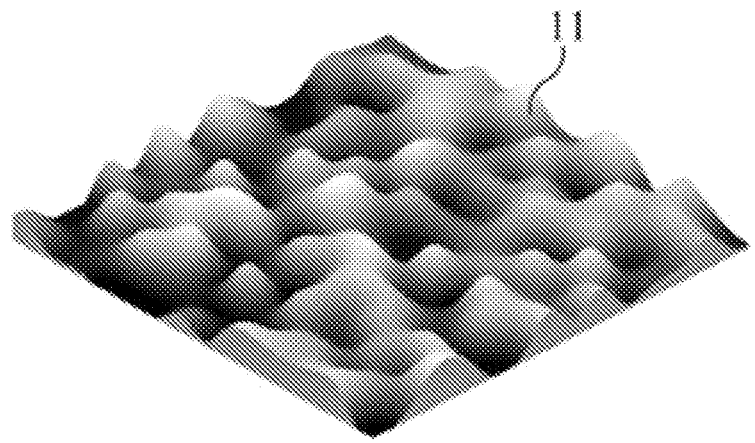
FIGS. 1A and 1B show an example of a phase mask and a point spread function.
Figure 1B:
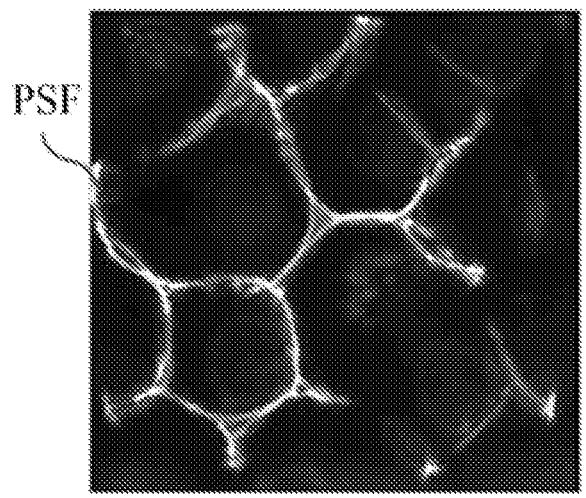
Figure 2A:
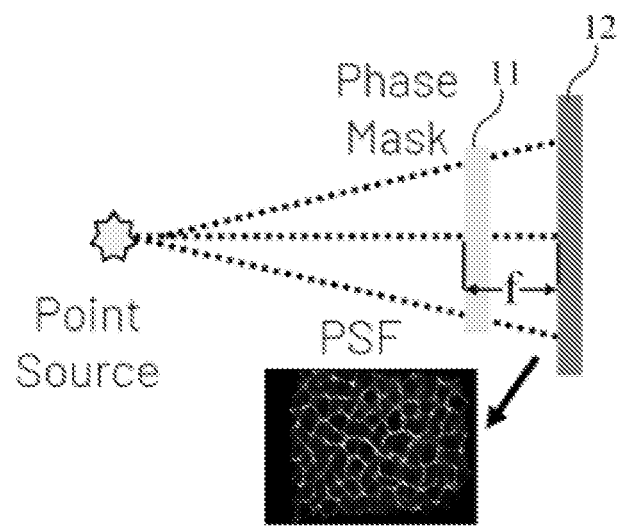
FIGS. 2A and 2B are a diagram for explaining a phase mask-based lens-less imaging method.
Figure 2B:
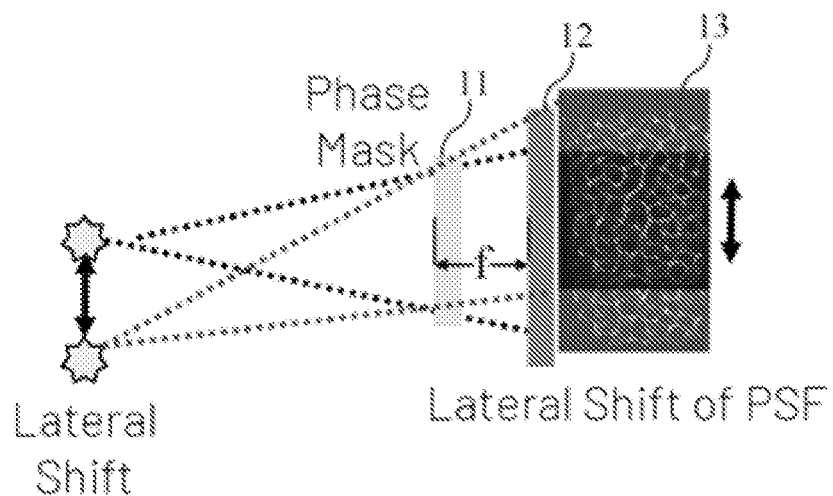

Once the replica mold 52 is obtained, the thickness required for the phase mask 55 to be manufactured is calculated (43). As described above, the master phase mask 51 may be a phase mask applied to an existing lens-less camera, in which, as shown in FIGS. 2A and 2B, it is used spaced apart from the image sensor 12 by a focal distance (f). In contrast, it is assumed that the phase mask 55 generated according to the phase mask manufacturing method of the embodiment is disposed or formed directly on the image sensor 53. Therefore, the incident light incident on the master phase mask 51, which is the existing phase mask 11, is propagated using the material of the master phase mask 51 and the air present in the space between the master phase mask 51 and the image sensor 12 as a medium, and at this time, refraction occurs due to the difference in medium. That is, the focal distance (f) for the master phase mask 51 is a distance obtained by reflecting the thickness of the air layer existing between the master phase mask 51 and the image sensor 12 along with the material and thickness of the master phase mask 51, which is the medium.

However, in the embodiment, as described above, since the phase mask 55 is manufactured on the premise that it is disposed or formed directly on the image sensor 53, not only should the influence of the air layer be excluded first, but also the thickness of the phase mask 55 to obtain the same level of point spread function (PSF) should be determined by also considering the refractive index due to the change in the material forming the phase mask 55. Accordingly, in the embodiment, before manufacturing the phase mask 55 that is disposed directly on the image sensor 53 from the master phase mask 51, the thickness of the phase mask 55 is determined such that the manufactured phase mask 55 has a desired point spread function (PSF).

Here, the thickness of the phase mask 55 may be calculated based on, for example, a ray tracing technique for tracing a light propagation path, and a detailed description thereof will be described below.

Once the thickness of phase mask 55 is calculated, as shown in (c) of FIG. 5A, a supporter 54 forming a space in which a material forming the phase mask 55 is to be disposed is coupled around the image sensor 53 (44). At this time, the size of the supporter 54 is formed to protrude from the image sensor 53 by the calculated thickness. This is to enable the phase mask 55 to be manufactured to have the calculated thickness.

Then, a phase mask material for implementing the phase mask 55 is injected into the space formed by the supporter 54 disposed around the image sensor 53 (45). Various materials may be used to implement the phase mask 55, but here, it is assumed that polyurethane acrylate (hereinafter, PUA) resin is used as an example. PUA (especially PUA311) has high light transmittance (>90% at 1 mm thickness) in the wavelength of visible light and excellent mechanical properties, so it is a suitable material for manufacturing the phase mask 55, and has a property of being cured by ultraviolet (hereinafter, UV) light 56. Since the height of supporter 54 has the calculated thickness, the injected phase mask material also has the calculated thickness.

When the phase mask material is injected into the space formed by the supporter 54, as shown in (c) of FIG. 5A, one surface of the replica mold 52 on which the inverted phase shift pattern is formed is placed in close contact with the upper surface (46). As the phase mask material is before curing, the upper surface of the phase mask material having fluidity is fluidly changed into a pattern in which the inverted phase pattern of the replica mold 52 placed in close contact is inverted again.

Then, as shown in (d) of FIG. 5B, by placing the phase mask material with replica mold 52 disposed on the top surface, in a UV chamber (not shown) and exposing it to UV light 56 to cure, the phase mask 55 is implemented in which the phase shift pattern of the master phase mask 51 is replicated (47). As an example, the phase mask material may be cured by exposure to UV light 56 at an intensity of 35 W for 5 minutes. At this time, since the replica mold 52 is also implemented with a transparent material, the UV light 56 is incident into the phase mask material through the replica mold 52, so that the phase mask material can be easily cured.

In addition, by removing the replica mold 52 and the supporter 54 as shown in (e) of FIG. 5B, the phase mask 55 integrally and directly formed on the image sensor 53 can be obtained as shown in (f) of FIG. 5B (48).

As described above, according to the method for manufacturing a phase mask according to an embodiment, phase masks 55 having the same phase shift pattern can be quickly and easily mass-produced by a simple process using a replica mold 52 and UV light 56. As a result, it is possible to mass-produce an excellent phase mask 55 at low cost, and also to rapidly manufacture a lens-less camera at low cost.

Figure 6:
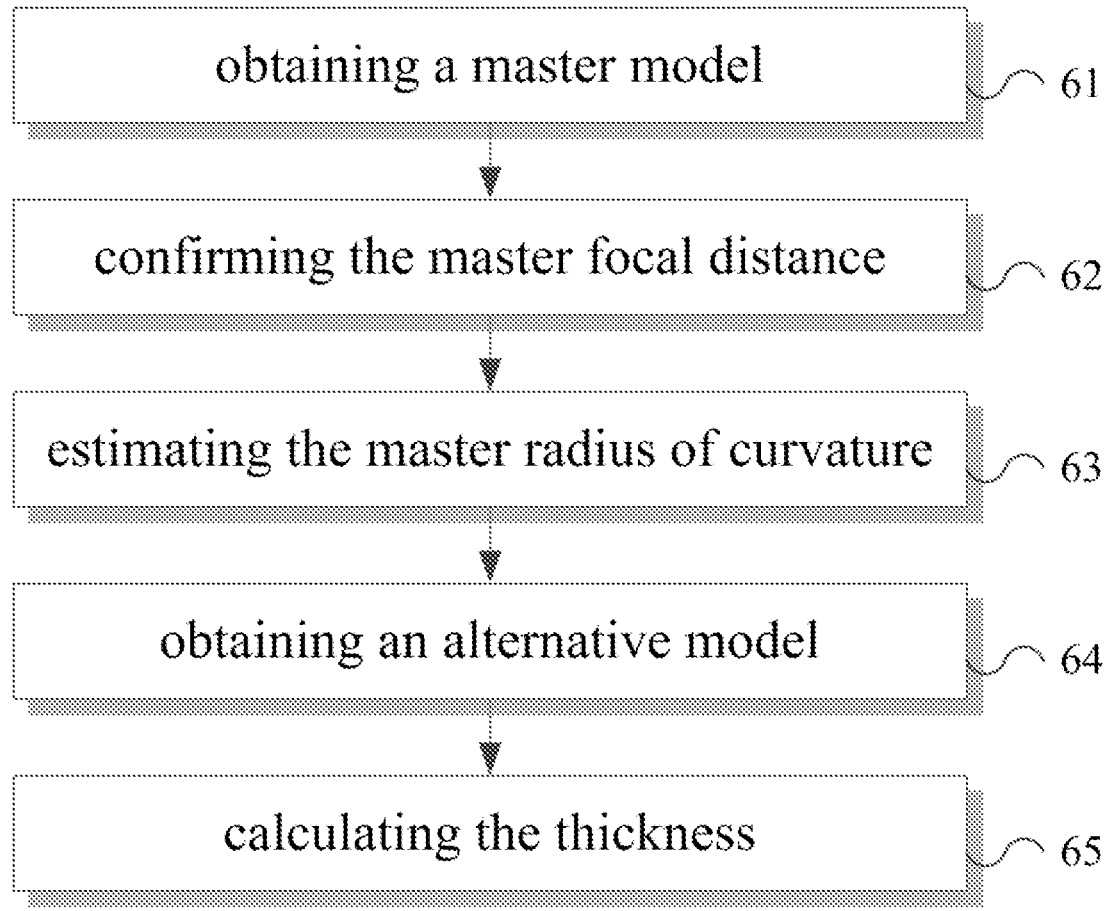
FIG. 6 shows a phase mask thickness calculation process of FIG. 4 in detail.
Figure 7:
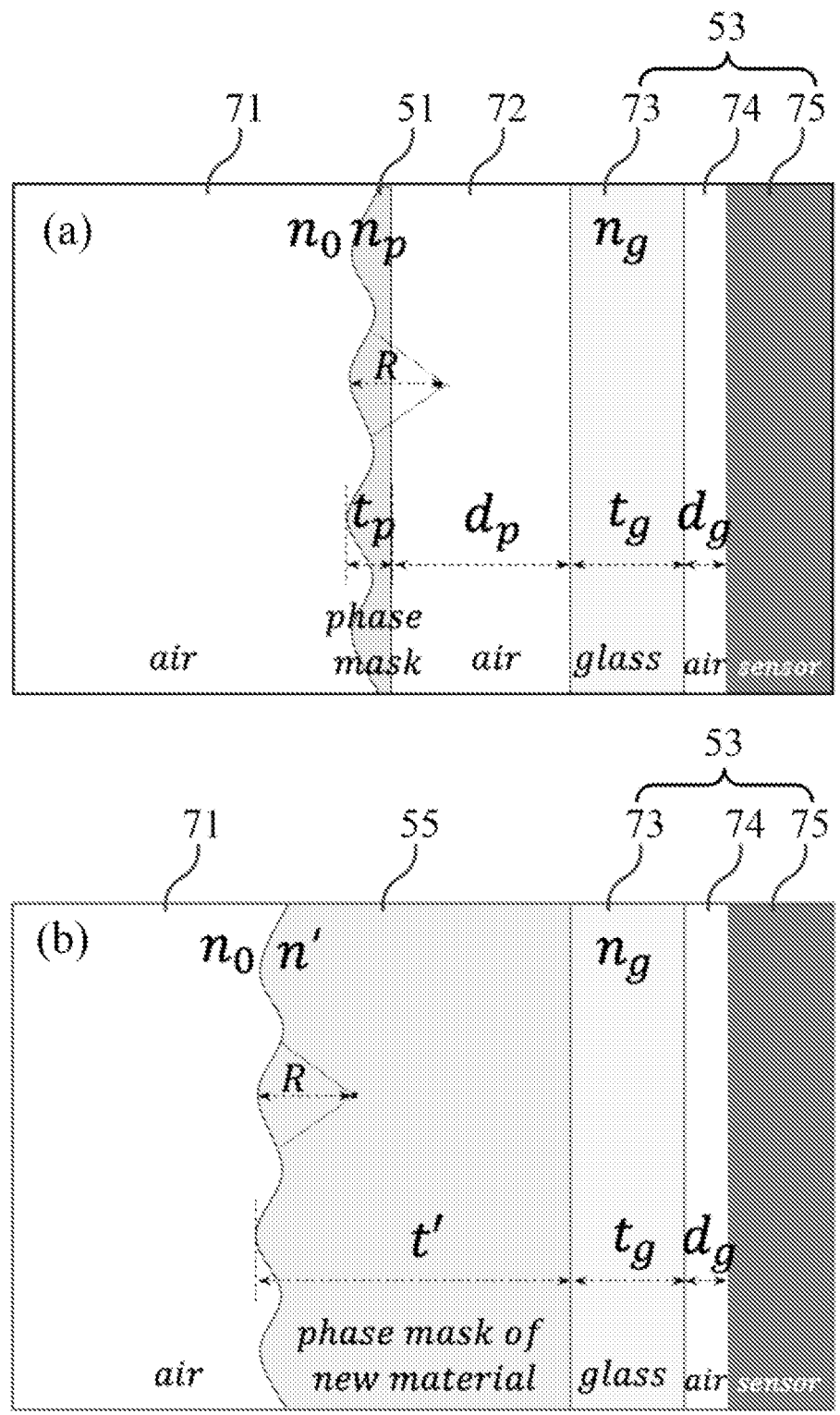
FIG. 7 is a diagram for explaining a concept for calculating the thickness of the phase mask of FIG. 6.

FIG. 6 shows a phase mask thickness calculation process of FIG. 4 in detail, and FIG. 7 is a diagram for explaining a concept for calculating the thickness of the phase mask of FIG. 6.

In FIG. 7, (a) shows a light path when the master phase mask 51 is applied, and (b) shows a light path when the phase mask 55 is applied.

Figure 8:
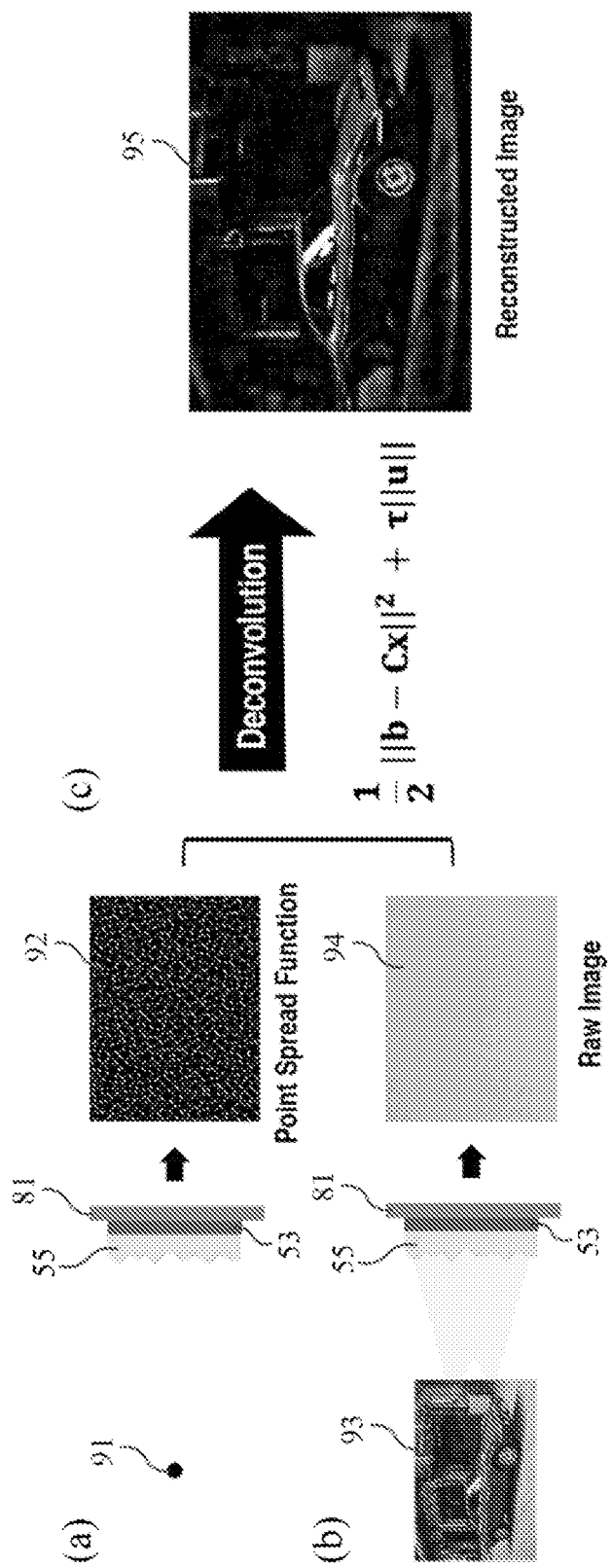
FIG. 8 is a diagram for explaining a process of obtaining a reconstructed image using a lens-less camera module manufactured according to an embodiment.

Referring to FIGS. 6 to 8, in the step of calculating a thickness of a phase mask, first, when light is incident to the master phase mask 51 at an incident position (y) and an incident angle (θ) according to the ray tracing technique, a master model is obtained for a light path to be passed until reaching the sensing surface of the image sensor 53 at a projection position (y') and a projection angle (θ') (61). As shown in (a) of FIG. 7, the master model may be obtained based on the configuration of media positioned between the phase shift pattern of the master phase mask 51 and the sensing surface.

Referring to (a) of FIG. 7, light incident on the master phase mask 51 at an incident position (y) and an incident angle (θ) passes through an air layer 71 between the master phase mask 51, the master phase mask 51, an air layer 72 between the master phase mask 51 and the image sensor 53, a cover glass 73 of the image sensor 53, and an air layer 74 between the cover glass 73 and the sensor chip 75, and is projected to a projection position (y') on the sensing surface of the sensor chip 75 at a projection angle (θ').

Accordingly, in the master model modeled with the ray tracing technique, in consideration of the incident position and direction of light, the refractive index ($n_0$) of the air layer 71 as a medium between the master phase mask 51, the radius of curvature (R) of the phase shift pattern formed on the master phase mask 51, the refractive index ($n_p$) according to the material implementing the master phase mask 51, the thickness ($t_p$) of the master phase mask 51, the gap ($d_p$) of the air layer 72 between the master phase mask 51 and the cover glass 73 of the image sensor 53, the thickness ($t_g$) and refractive index ($n_g$) of the cover glass 73, and the gap ($d_g$) of the air layer 74 between the cover glass 73 and the sensor chip 75, the projection angle (θ') at the projection position (y') can be calculated as in Equation 1.

$$\begin{bmatrix} y' \\ \theta' \end{bmatrix} = \begin{bmatrix} 1 & d_g \\ 0 & 1 \end{bmatrix} \begin{bmatrix} 1 & 0 \\ 0 & \frac{n_g}{n_0} \end{bmatrix} \begin{bmatrix} 1 & t_g \\ 0 & 1 \end{bmatrix} \begin{bmatrix} 1 & 0 \\ 0 & \frac{n_0}{n_g} \end{bmatrix} \quad \text{[Equation 1]}$$

-continued $$\begin{bmatrix} 1 & d_p \\ 0 & 1 \end{bmatrix} \begin{bmatrix} 1 & 0 \\ 0 & \frac{n_p}{n_0} \end{bmatrix} \begin{bmatrix} 1 & t_p \\ 0 & 1 \end{bmatrix} \begin{bmatrix} 1 & 0 \\ \frac{n_0 - n_p}{Rn_p} & \frac{n_0}{n_p} \end{bmatrix} \begin{bmatrix} y \\ \theta \end{bmatrix}$$

The refractive index ($n_0$) of the air layers 71 and 72 is known to be 1, and assuming that the master phase mask 51 is implemented with, for example, polycarbonate, the refractive index ($n_p$) of the master phase mask 51 may be 1.59. In addition, the cover glass 73 may be implemented with glass, and the refractive index ($n_g$) of the glass is 1.52. The thickness ($t_p$) of the master phase mask 51, the gap ($d_p$) of the air layer 72 between the master phase mask 51 and the cover glass 73 of the image sensor 53, the thickness ($t_g$) of the cover glass 73, and the gap ($d_g$) of the air layer 74 between the cover glass 73 and the sensor chip 75 are also information that can be confirmed by measurements or specifications.

Therefore, the information not confirmed in Equation 1 is the incident position (y) and the incident angle (θ), the projection position (y') and the projection angle (θ'), the radius of curvature (R) of the phase shift pattern formed on the master phase mask 51, and the spacing ($d_p$) of the air layer 72. Among them, the radius of curvature (R) is determined by the phase mask pattern and therefore is not adjusted. However, as shown in (a) of FIG. 7, the spacing ($d_p$) of the air layer 72 is an adjustable variable, and is a factor determining the focal distance (f) when the master phase mask 51 is used. Therefore, if the focal distance (f) is confirmed, the spacing ($d_p$) of the air layer 72 can also be obtained.

Accordingly, the spacing ($d_p$) of the air layer 72 is confirmed by measuring the focal distance (f) of the master phase mask 51 (62).

However, when it is difficult to confirm the focal distance (f), it may also be obtained by measuring the spacing ($d_p$) of the air layer 72 to minimize the full-width at half maximum (hereinafter, FWHM) of the light projected onto the image sensor 53 and sensed. This is because the minimum FWHM of the projected light means that the sharpness of the light is high.

Then, when the spacing ($d_p$) of the air layer 72 is determined, the radius of curvature (R) of the phase shift pattern is estimated (63).

In order to estimate the radius of curvature (R) of the phase shift pattern, the master model of Equation 1 is simplified as in Equation 2.

$$\begin{bmatrix} y' \\ \theta' \end{bmatrix} = \begin{bmatrix} N_{11} & N_{12} \\ N_{21} & N_{22} \end{bmatrix} \begin{bmatrix} y \\ \theta \end{bmatrix}$$ [Equation 2]

In the simplified Equation 2, in order for the incident light to converge on the projection position (y) of the sensor surface of the sensor chip 75 in the image sensor 53, the value of the matrix element $N_{11}$ must be 0. Therefore, when rearranging Equation 2 based on the radius of curvature (R) of the phase shift pattern by substituting the value of the matrix element $N_{11}$ with 0, Equation 3 is derived.

$$R = \frac{n_p - n_0}{n_p}\left[t_p + t_g + \frac{n_p}{n_0}(d_g + d_p)\right]$$ [Equation 3]

Meanwhile, an alternative model for the case of using the phase mask 55 manufactured on the image sensor 53 according to the embodiment by replacing the master phase mask 51 is obtained again according to the ray tracing technique (64). Referring to (b) of FIG. 7, since the phase mask 55 manufactured according to the embodiment is manufactured on the image sensor 53, the air layer 72 does not exist between the phase mask 55 and the image sensor 53. That is, the air layer 72 must be removed in the alternative model. In addition, since the phase mask 55 may be implemented with a material different from that of the master phase mask 51, the refractive index (n') of the phase mask 55 may be different from the refractive index ($n_p$) of the master phase mask 51.

Considering the above difference, the alternative model according to the ray tracing technique can be obtained as shown in Equation 4.

$$\begin{bmatrix} y' \\ \theta' \end{bmatrix} =$$ [Equation 4]

$$\begin{bmatrix} 1 & d_g \\ 0 & 1 \end{bmatrix}\begin{bmatrix} 1 & 0 \\ 0 & \frac{n_g}{n_0} \end{bmatrix}\begin{bmatrix} 1 & t_g \\ 0 & 1 \end{bmatrix}\begin{bmatrix} 1 & 0 \\ 0 & \frac{n'}{n_g} \end{bmatrix}\begin{bmatrix} 1 & t' \\ 0 & 1 \end{bmatrix}\begin{bmatrix} 1 & 0 \\ \frac{n_0 - n'}{Rn'} & \frac{n_0}{n'} \end{bmatrix}\begin{bmatrix} y \\ \theta \end{bmatrix}$$

In order for the phase mask 55 manufactured according to the embodiment to replace the master phase mask 51, it should be possible to generate the same point spread function (PSF) under the same conditions as the master phase mask 51. That is, in order for the phase mask 55 to be able to replace the master phase mask 51, when light is incident at an incident position (y) and an incident angle (θ), the phase mask 55 must have the same focusing conditions as the master phase mask 51 so that light is projected on the image sensor 53 at a projection position (y') and a projection angle (θ').

Since the phase shift pattern of the phase mask 55 is formed by duplicating the phase shift pattern of the master phase mask 51, the phase shift pattern of the phase mask 55 is the same as that of the master phase mask 51. Therefore, the radius of curvature (R) of the phase mask 55 and the radius of curvature (R) of the master phase mask 51 are the same.

As a result, the adjustable variable in Equation 4 is the thickness (t') of the phase mask 55. Accordingly, the thickness (t') of the phase mask 55 is calculated to make the phase mask 55 have the same focusing conditions as the master phase mask 51 (65). The thickness (t') of the phase mask 55 can be calculated as Equation 5 by combining Equations 1 and 4.

$$t' = \frac{Rn'}{n' - n_0} - \frac{n'}{n_g}\left(t_g + d_g\frac{n_g}{n_0}\right)$$ [Equation 5]

In addition, since the radius of curvature (R) of the phase mask 55 is obtained by Equation 3, the thickness (t') of the phase mask 55 can be easily calculated.

In the above, it was assumed that the image sensor 53 included the sensor chip 75 and the cover glass 73 spaced apart from the sensor chip 75 with an air layer 74 interposed therebetween, so the cover glass 73 and the air layer 74 were reflected in the master model and the alternative model, respectively. However, when the cover glass 73 is not included in the image sensor 53, the phase mask 55 may be formed directly on the sensor chip 75, and in this case, items corresponding to the cover glass 73 and the air layer 74 in the master model and the alternative model may be omitted.

Here, the refractive index (n') of the phase mask 55 implemented with PUA is 1.47. In this case, the thickness (t') of the phase mask 55 may be calculated as 1.28 mm. Then, the height of the supporter 54 may be determined according to the calculated thickness (t') of the phase mask 55, and the supporter 54 having the determined height may be manufactured and placed around the image sensor 53 (46).

The phase mask 55 manufactured according to the embodiment may be integrally formed directly on the image sensor 53 without requiring a separate support. Accordingly, the lens-less camera module can be easily manufactured through a simple process of coupling the image sensor 53 on which the phase mask 55 is integrally formed to the module substrate 81 of the lens-less camera module. That is, the manufacturing process of the lens-less camera module can be greatly simplified.

In the above, it has been described that the supporter 54 is removed after the phase mask 55 is manufactured. However the supporter 54 may be maintained without being removed. In this case, the supporter 54 may be used as a guide supporting the phase mask 55 while protecting the image sensor 53. And even if the supporter 54 is maintained, since the supporter 54 is also integrally formed with the image sensor 53 together with the phase mask 55, the lens-less camera module can be manufactured by a simple process of coupling the image sensor 53 to the module substrate 81.

In FIGS. 4 and 6, it is described that each process is sequentially executed, but this is only illustratively described, and a person skilled in the art may change and execute the sequence shown in FIGS. 4 and 6 within the range not departing from the essential characteristics of the embodiment of the present disclosure, or may apply various modifications and variations by executing one or more processes in parallel or adding another process.

FIG. 8 is a diagram for explaining a process of obtaining an image using a lens-less camera module manufactured according to an embodiment.

FIG. 8 is a diagram for explaining a process of obtaining an image using a lens-less camera module in which the phase mask 55 and the image sensor 53 are integrally implemented, but the process of obtaining an image using a lens-less camera module in which the phase mask 11 and the image sensor 12 are spaced apart from each other, as shown in FIG. 2, is also the same in principle.

Referring to FIG. 8, in order to obtain an image using the lens-less camera module, first, as shown in (a), the point light source 91 irradiates light to the lens-less camera module, and when the light is incident on the image sensor 53 through the phase mask 55, the image sensor 53 sets the obtained 2D image as a point spread function (PSF) 92 and stores it.

Then, the scene 93 to be obtained is photographed using the lens-less camera module. The scene 93 can be viewed as a set of a plurality of point light sources, and accordingly, light emitted from the plurality of point light sources constituting the scene 93 is incident on the image sensor 53 through the phase mask 55, respectively. At this time, the point spread function (PSF) formed by the light emitted from each point light source is shifted and overlapped according to the position of the point light source and incident to the image sensor 53, and the image sensor 53 detecting the overlapped incident light obtains a raw image 94. At this time, since each of the lights emitted from the plurality of point light sources constituting the scene 93 is phase-shifted by the phase mask 55 and superimposed in the form of a point spread function (PSF) and projected onto the image sensor 53, the raw image 94 obtained by the image sensor 53 is acquired in the form of an image in which the scene 93 cannot be inferred.

However, on the contrary, since the raw image 94 is an image obtained by overlapping a plurality of point spread functions (PSFs) shifted to different positions, a scene image 95 for the scene 93 can be reconstructed by first performing a convolution operation on the raw image 94 using the point spread function (PSF) based on the stored point spread function (PSF) to extract an image by each point light source, and then performing a deconvolution operation based on the point spread function (PSF) again. However, reconstructing the scene image 95 by deconvolution operation has a very high computational complexity, and there is a limitation in the area where the image sensor 53 can sense light, so it cannot be performed in a conventional manner.

Accordingly, in general, the raw image 94 is reconstructed into the scene image 95 using an alternating direction method of multipliers (ADMM) algorithm or the like. In this case, the raw image 94 obtained through the phase mask 55 can be reconstructed into the scene image 95, by setting an image conversion model in advance, and using an optimization method that repeatedly updates the image conversion model such as Equation 6 such that the error between the image converted in the image conversion model and the lens-based image is minimized.

$$\text{minimize } \tfrac{1}{2}\|b-Cx\|^2+\tau\|u\|_1$$

$$\text{subject to } x=Mv, u=\Psi v, w=v, w\geq 0 \quad [\text{Equation 6}]$$

wherein, v is a vectorized 2D intensity in the scene, M is a matrix operator corresponding to 2D convolution based on the point spread function (PSF), C is a truncation operator for each size of the image sensor, b represents a captured measurement value, $\Psi$ is a gradient operator, and $\tau$ represents a weight for the overall fluctuating regularization term.

Figure 9:
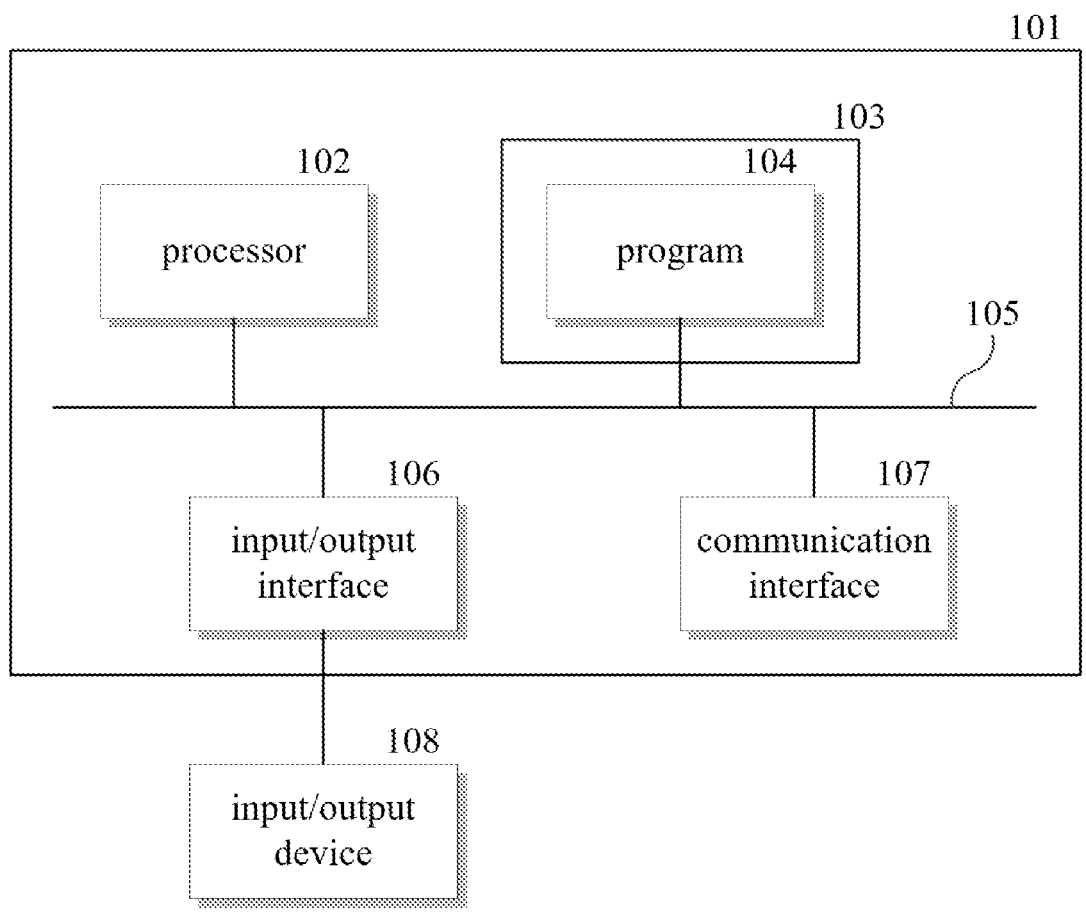
FIG. 9 is a diagram for explaining a computing environment including a computing device according to an embodiment.

FIG. 9 is a diagram for explaining a computing environment including a computing device according to an embodiment.

In the illustrated embodiment, each component may have different functions and capabilities other than those described below, and may include additional components other than those described below. The illustrated computing environment 100 includes a computing device 101 for performing the method for manufacturing the phase mask illustrated in FIG. 3.

The computing device 101 includes at least one processor 102, computer readable storage medium 103 and communication bus 105. The processor 102 may cause computing device 101 to operate according to the above-mentioned exemplary embodiments. For example, the processor 102 may execute one or more programs 104 stored on the computer readable storage medium 103. The one or more programs 104 may include one or more computer executable instructions, and the computer executable instructions may be configured, when executed by processor 102, to cause computing device 101 to perform operations in accordance with an exemplary embodiment.

The communication bus 105 interconnects various other components of computing device 101, including processor 102 and computer readable storage medium 103.

The computing device 101 may also include one or more input/output interfaces 106 providing interfaces for one or more input/output devices 108 and one or more communication interfaces 107. The input/output interface 106 and the communication interface 107 are connected to the communication bus 105. The input/output device 108 may be coupled to other components of the computing device 101 through the input/output interface 106. Exemplary input/output devices 108 may include input devices such as a pointing device (a mouse or trackpad or the like), a keyboard, a touch input device (a touchpad or touchscreen or the like), a voice or sound input device, various types of sensor devices, and/or a filming device, and/or output devices such as a display device, a printer, a speaker and/or a network card. The exemplary input/output device 108 may be included inside the computing device 101 as a component constituting the computing device 101, and may also be connected with the computing device 101 as a separate device distinct from the computing device 101.

While the present disclosure has been described in detail with reference to representative embodiments, those skilled in the art will understand that various modifications and equivalent other embodiments are possible therefrom. Therefore, the true technical scope of the present disclosure is to be defined by the technical spirit set forth in the appended scope of claims.

What is claimed is:

1. A method for manufacturing a phase mask, the method being performed by a computing device having one or more processors and a memory storing one or more programs executed by the one or more processors, the method comprising the steps of:
    obtaining a replica mold on which an inverted phase shift pattern is formed in which a phase shift pattern of a master phase mask spaced apart from an image sensor is inverted;
    calculating a thickness of a phase mask disposed on the image sensor replacing the master phase mask;
    arranging a photocurable material for implementing the phase mask on the image sensor to a calculated thickness, placing the replica mold on an upper surface of the photocurable material, and then curing the photocurable material; and
    removing the replica mold from the top of the phase mask.

2. The method for manufacturing a phase mask according to claim 1,
    wherein the step of calculating a thickness includes determining the thickness of the phase mask, such that the light incident to the master phase mask at an incident position and an incident angle is projected at the same projection position and projection angle of the image sensor after the master phase mask is replaced by the phase mask.

3. The method for manufacturing a phase mask according to claim 2,
    wherein the step of calculating a thickness includes:
    when the master phase mask is spaced apart from the image sensor using a ray tracing technique, obtaining a master model modeling a path on which incident light incident to the master phase mask is projected onto the image sensor, and
    when the phase mask is disposed on the image sensor, obtaining an alternative model modeling a path on which incident light incident to the phase mask is projected onto the image sensor, and
    setting the incident position and incident angle, projection position and projection angle the same in the master model and the alternative model, thereby calculating the thickness of the phase mask.

4. The method for manufacturing a phase mask according to claim 3,
    wherein the image sensor includes a sensor chip for sensing light and a cover glass spaced apart from the sensor chip with an air layer interposed therebetween, and
    the phase mask is formed on the cover glass.

5. The method for manufacturing a phase mask according to claim 4,
    wherein the thickness of the phase mask is calculated by $$t' = \frac{Rn'}{n' - n_0} - \frac{n'}{n_g}\left(t_g + d_g \frac{n_g}{n_0}\right) \quad \text{Equation}$$

wherein t' represents the thickness of the phase mask;
    R represents the radius of curvature of the phase shift pattern of the master phase mask and the phase mask;
    n' represents the refractive index of the phase mask;
    $n_0$ represents the refractive index of the air layer;
    $n_g$ represents the refractive index of the cover glass;
    $d_g$ represents the distance between the sensor chip and the cover glass; and
    $t_g$ represents the thickness of the cover glass,
    and wherein the radius of curvature is calculated by $$R = \frac{n_p - n_0}{n_p}\left[t_p + t_g + \frac{n_p}{n_0}(d_g + d_p)\right] \quad \text{Equation}$$

wherein $n_p$ represents the refractive index of the master phase mask;
    $t_p$ represents the thickness of the master phase mask; and
    $d_p$ represents the distance between the master phase mask and the image sensor.

6. The method for manufacturing a phase mask according to claim 5,
    wherein the distance between the master phase mask and the image sensor is calculated using a focal distance at which a point spread function according to a phase shift pattern of the master phase mask detected by the image sensor appears most clearly.

7. The method for manufacturing a phase mask according to claim 5,
    wherein the distance between the master phase mask and the image sensor is obtained by measuring a distance at which a full-width at half maximum (hereinafter, FWHM) according to a diffusion range of the incident light incident on the master phase mask detected by the image sensor is minimized.

8. The method for manufacturing a phase mask according to claim 1,
    wherein the step of obtaining a replica mold includes forming a replica mold by disposing and curing a mold replication agent on one surface of the master phase mask on which the phase shift pattern is formed, and separating the formed replica mold from the master phase mask.

9. The method for manufacturing a phase mask according to claim 1,
    wherein the step of curing includes determining a height of a supporter with the calculated thickness of the phase mask, placing the supporter having the determined height around the image sensor, injecting a photocurable material for implementing the phase mask into a space formed by the image sensor and the supporter, placing the inverted phase shift pattern formed in the replica mold to contact the upper surface of the injected photocurable material, and then curing the photocurable material by irradiating light thereon to form a phase mask integrally coupled to the image sensor.

10. The method for manufacturing a phase mask according to claim 9, wherein the step of removing the replica mold includes separating the replica mold from the phase mask, and removing the supporter placed around the image sensor.

11. A method for manufacturing a lens-less camera module, the method being performed by a computing device having one or more processors and a memory storing one or more programs executed by the one or more processors, the method comprising the steps of:

obtaining a replica mold on which an inverted phase shift pattern is formed in which a phase shift pattern of a master phase mask spaced apart from an image sensor is inverted;

calculating a thickness of a phase mask disposed on the image sensor replacing the master phase mask;

arranging a photocurable material for implementing the phase mask on the image sensor to a calculated thickness, placing the replica mold on an upper surface of the photocurable material, and then curing the photocurable material;

removing the replica mold from the top of the phase mask; and coupling the image sensor, on the upper surface of which the phase mask is integrally formed, to a module substrate.

12. The method for manufacturing a lens-less camera module according to claim 11, wherein the step of calculating a thickness includes determining the thickness of the phase mask, such that the light incident to the master phase mask at an incident position and an incident angle is projected at the same projection position and projection angle of the image sensor after the master phase mask is replaced by the phase mask.

13. The method for manufacturing a lens-less camera module according to claim 12, wherein the step of calculating a thickness includes:

when the master phase mask is spaced apart from the image sensor using a ray tracing technique, obtaining a master model modeling a path on which light incident to the master phase mask is projected onto the image sensor, and when the phase mask is disposed on the image sensor, obtaining an alternative model modeling a path on which light incident to the phase mask is projected onto the image sensor, and setting the incident position and incident angle, projection position and projection angle the same in the master model and the alternative model, thereby calculating the thickness of the phase mask.

14. The method for manufacturing a lens-less camera module according to claim 13, wherein the image sensor includes a sensor chip for sensing light and a cover glass spaced apart from the sensor chip with an air layer interposed therebetween, and the phase mask is formed on the cover glass.

15. The method for manufacturing a lens-less camera module according to claim 11, wherein the step of obtaining a replica mold includes forming a replica mold by disposing and curing a mold replication agent on one surface of the master phase mask on which the phase shift pattern is formed, and separating the formed replica mold from the master phase mask.

16. The method for manufacturing a lens-less camera module according to claim 11, wherein the step of curing includes determining a height of a supporter with the calculated thickness of the phase mask, placing the supporter having the determined height around the image sensor, injecting a photocurable material for implementing the phase mask into a space formed by the image sensor and the supporter, placing the inverted phase shift pattern formed in the replica mold to contact the upper surface of the injected photocurable material, and then curing the photocurable material by irradiating light thereon to form a phase mask integrally coupled to the image sensor.

17. The method for manufacturing a lens-less camera module according to claim 16, wherein the step of removing the replica mold includes separating the replica mold from the phase mask, and removing the supporter placed around the image sensor.

* * * * *